United States Patent [19]

Kodai et al.

[11] Patent Number: 4,974,120
[45] Date of Patent: Nov. 27, 1990

[54] IC CARD

[75] Inventors: Syojiro Kodai; Katsunori Ochi, both of Itami, Japan

[73] Assignee: Mitsubishi Denki Kabushiki Kaisha, Japan

[21] Appl. No.: 395,434

[22] Filed: Aug. 17, 1989

[30] Foreign Application Priority Data

Jan. 12, 1989 [JP] Japan .................................. 1-5708

[51] Int. Cl.$^5$ .............................................. H05K 7/00
[52] U.S. Cl. ..................................... 361/392; 235/488; 361/400; 361/406
[58] Field of Search ............... 235/488, 489, 493, 495; 361/380, 392, 393, 397, 400, 401, 406

[56] References Cited

U.S. PATENT DOCUMENTS

| | | | |
|---|---|---|---|
| 4,695,925 | 9/1987 | Kodai et al. | 361/395 |
| 4,727,246 | 2/1988 | Hara et al. | 235/488 |
| 4,780,603 | 10/1988 | Hamada | 235/492 |
| 4,792,843 | 12/1988 | Tehrani et al. | 235/488 |
| 4,829,168 | 5/1989 | Nakahara | 235/489 |
| 4,843,225 | 6/1989 | Hoppe | 235/492 |

FOREIGN PATENT DOCUMENTS 60-189587  9/1985  Japan .
60-217492 10/1985  Japan .
61-222712 10/1986  Japan .

Primary Examiner—Gregory D. Thompson
Attorney, Agent, or Firm—Leydig, Voit & Mayer

[57] ABSTRACT

An IC card includes a terminal board at one end of and projecting from an obverse side of the circuit board, an IC module mounted on the reverse side, all embedded in a plastic body with an electrode terminal exposed through the body.

3 Claims, 3 Drawing Sheets

FIG. IA
PRIOR ART
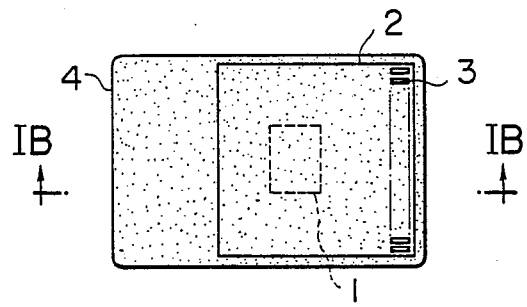
FIG. IB
PRIOR ART
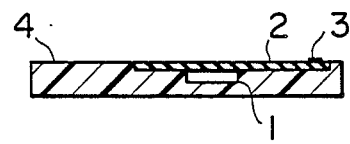
FIG. 2A
PRIOR ART
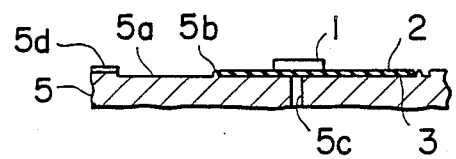
FIG. 2B
PRIOR ART
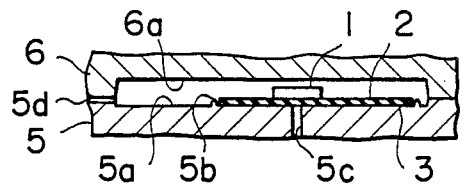

IC CARD

BACKGROUND OF THE INVENTION

1. Field of the Invention

The present invention relates to an IC card formed by mounting an IC (Integrated Circuit) on a circuit board and molding them with resin.

2. Description of the Related Art

FIG. 1A is a plan view which illustrates a conventional IC card, and FIG. 1B is a cross-sectional view which illustrates the same. An integrated circuit 1 (abbreviated as "IC" hereinafter) is mounted on a reverse side of a circuit board 2 and connected to a circuit (not shown) formed on the same side of the circuit board 2. A plurality of electrode terminals 3 for establishing an electrical connection between the IC 1 and external equipment is disposed at an end portion of the inverse side of the circuit board 2, that is, the obverse side of the same. The electrode terminals 3 are connected to the above circuit formed on the reverse side of the circuit board 2. Thus-formed circuit board 2 is fitted and bonded, with an adhesive (not shown), within a recessed portion formed in a card base body 4 composed of molding synthetic resin, to expose the obverse side of the circuit board. In an another method for assembling of the IC card, as shown in FIGS 2A and 2B, the thus-formed circuit board 2 is molded by sealing with resin as follows: first, the circuit board 2 is, as shown in FIG. 2A, disposed within a recessed portion 5a of the lower mold 5 such that the side on which the electrode terminal 3 is disposed is faces downward and the two ends thereof are respectively supported by a pair of positioning projections 5b. Then, the circuit board 2 is fixed within the recessed portion 5a by reducing pressure through a suction hole 5c. Next, as shown in Fig. 2B, an upper mold 6 is secured to the lower mold 5. Then, molten synthetic resin is introduced through a runner 5d and injected into the recessed portions 5a and 6a. Thus, as shown in FIG. 1, an IC card in which the circuit board 2 is embedded in the card base body 4 and integrated with the latter is completed with the obverse side of the circuit board 2 esposed.

In the conventional IC card formed as described above, a problem arises from adhering the circuit board 2 to the IC 1. The IC 1 is secured to the reverse side of circuit board 2 in the recessed portion of the card base body 4 which has been previously molded. The problem is deterioration of the adhesion and water invasion from outside to the adhered portion. On the other hand, an IC card formed by integrally embedding one side of the circuit board 2 with synthetic resin cannot be readily secured to the mold. In addition, a large portion of one surface of the IC card 1 covered by the obverse surface of the circuit board 2, which harms the appearance of the IC card. It as well causes a problem in that it is difficult to apply a print or the like to the surface, and caused a limitation in terms of design of the IC card. Another problem arises, due to the fact that the surface of the circuit board 2 is exposed on one surface of the card base body 4, in that the card can be warped due to the difference between the thermal expansion coefficients of the circuit board 2 and the card base body 4. As a result, bond strength between the circuit board 2 and the body 4 deteriorates.

SUMMARY OF THE INVENTION

In view of the above-described problems of the conventional IC card, an object of the present invention is to provide an IC card exhibiting advantages that the circuit board can be readily embedded in the card base, further the circuit board does not appear outside of the IC card, any warping of the card can be prevented, a reliability thereof can be improved, limitations in applying designs to the IC card can be removed, and the quality of the appearance the IC card can be improved.

A still further object of the present invention is to provide an apparatus for and a method of manufacturing an IC card of the type described above.

According to the present invention, a surface of a terminal board portion projects over one side of a circuit baord, the surface of the terminal board portion is placed on a bottom surface of a recessed portion of a lower mold, the terminal board portion is held by at least a pair of holding projections formed in a recessed portion of an upper mold from the reverse side thereof to secure the circuit board portion such that the other end portion of the circuit board floats in a recessed portions of the upper and the lower molds, and a circuit board portion is embedded in injecting synthetic resin. As a result, the IC card having a card base body wherein electrode terminal portion is only exposed on one surface of the IC card is formed. The at least one pair of pressing projections of the upper mold forms at least a pair of guide grooves at one of the end portions of the card base body.

BRIEF DESCRIPTION OF THE DRAWINGS

FIG. 1A is a plan view which illustrates a conventional IC card;

FIG. 1B is a sectional view taken along line IB—IB in FIG. 1A;

FIG. 2A is a partial side sectional view which illustreates a circuit board conventionally disposed in a lower mold;

FIG. 2B is a broken side sectional view which illustrates a state where an upper mold conventionally is secured to the lower mold shown in FIG. 2A;

DESCRIPTION OF THE PREFERRED EMBODIMENT

Figure 3A:
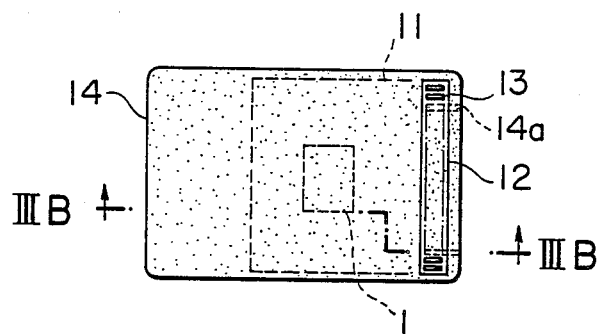
FIG. 3A is plan view which illustrates an IC card according to the present invention.
Figure 3B:
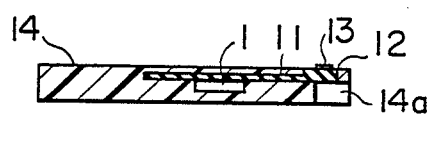
FIG. 3B is a sectional view taken along line IIIB—IIIB in FIG. 3A.
Figure 3C:
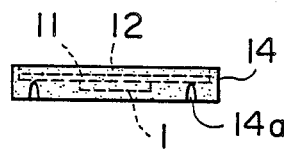
FIG. 3C is afront elevational view which illustrates the IC card shown in FIG. 3A.

FIGS. 3A to 3C are views which illustrate an embodiment of an IC card according to the present invention. Referring to the drawings, a terminal board portion 12 is integrally formed on or adhered to an end portion of a circuit board 11 raised from the surface of the circuit board 11. On the surface of the terminal substrate portion 12, a plurality of electrode terminals 13 for establishing connections outside of the IC card are formed. The plurality of electrode terminals 13 are connected to a circuit (not shown) on the reverse side of the circuit board 11. An IC 1 which is connected to the circuit is mounted on the other side, that is, the reverse side of the circuit board 11. A card base body 14 is formed by integrating and embedding the IC 1 and the circuit board 11 by injection-molding with synthetic resin. After molding only the electrode terminal portion 13 of the terminal board portion 12 is exposed to the outside of the IC card. A pair of guide grooves 14a having a depth from the reverse side of the card base body 14 to the reverse surface of the terminal board portion 12 is formed at the end portions of this card base body 14. These grooves 14a extend in the direction of insertion and withdrawal of the IC card. This pair of guide grooves 14a is formed by molding for preventing erroneous insertion of the IC card into the external equipment.

Figure 4A:
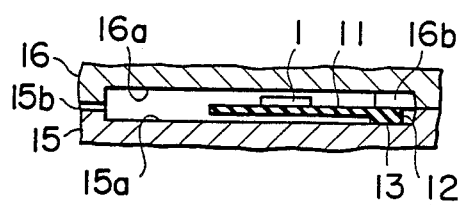
FIG. 4A is a partial side sectional view which illustrates the circuit board secured within a mold.
Figure 4B:
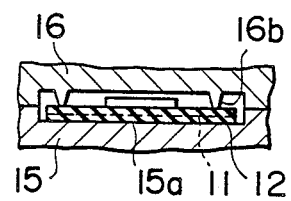
FIG. 4B is a partial front sectional view which illustrates the circuit board secured within a mold.

The above-described card base body 14 is molded as shown in FIGS. 4A and 4B. The circuit board 11 on which the IC 1 is mounted is put in the bottom portion of a recessed portion 15a of a lower mold 15 with the electrode terminal 13 facing downward. Then an upper mold 16 is secured to the lower mold 15. As a result, the terminal board portion 12 is pressed down from the reverse side by a pair of pressing projections 16b formed on the the recessed portion 16a in the upper mold 16. Consequently, the circuit board 11 is held such that the other end portion of the board 11 floats between the two recessed portions 15a and 16a. Then, the molten synthetic resin is injected through a runner 15b into the two recessed portions 15a and 16a and the mold device is cooled down thereafter. As the result, a card base body 14 which embeds the circuit board 11 with only the portion of the electrode terminals 13 exposed on the IC card surface is formed as the IC card shown in FIG. 3A. The guide grooves 14a are formed in the card base body 14 by means of the holding projections 16b of the upper mold 16.

Figure 5A:
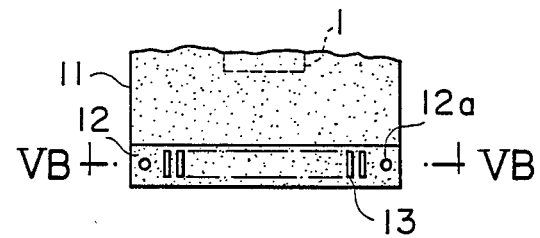
FIG. 5A is a partial plan view of a circuit board according to another embodiment of the present invention.
Figure 5B:
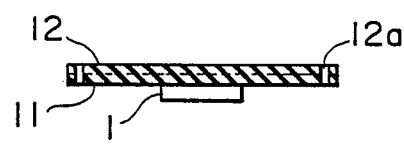
FIG. 5B is a sectional view taken along line VB—VB in FIG. 5A.
Figure 6:
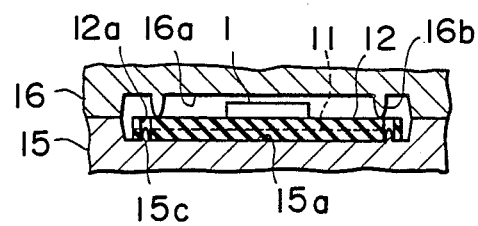
FIG. 6 is a partial front sectional view which illustrates the circuit substrate shown in FIG. 5A secured within a mold.
Figure 7:
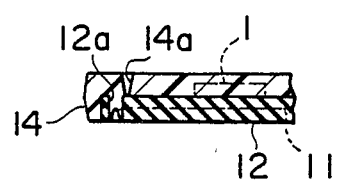
FIG. 7 is a partial front sectional view which illustrates an IC card whose card base body has been molded.

FIGS. 5A and 5B are views which illustrate a circuit board portion of an IC card according to a second embodiment of the present invention. The IC 1 is mounted on the reverse side of the circuit board 11, while a terminal board portion 12 is integrally formed on or adhered to an end portion of the obverse side of the circuit board 11. A plurality of electrode terminals 13 are formed on the terminal board portion 12, and a pair of positioning through holes 12a are formed on the both sides of the terminal board portion 12. The circuit board 11, as shown in FIG. 6, is disposed within the recessed portion 15a and 16a in the upper and lower molds 15 and 16 respectively. In the mold device, the terminal board portion 12 is held and secured between the bottom surface of the recessed portion 15a and the holding projection 16b. A pair of positioning pin portions 15c, which corresponds to the positioning holes 12a are formed on the the recessed portion 15a of the lower mold 15 for insertion into the positioning holes 12a to position the circuit board 11. Then the molten synthetic resin for molding is injected through a runner (see FIG. 4A) into the recessed portions 15a and 16a in the upper and lower molds 15 and 16, and the molded device is cooled down thereafter. As the result, a card base body 14 is such that only a portion of the terminal electrodes 13 are exposed on the IC card surface and the portion including the circuit board 11 is embedded in the body 14. The positioning pin portions 15c are formed conically and are shorter than the thickness of the terminal board 12 so that synthetic resin can be introduced into a portion of the positioning holes 12a. As a result, the circuit board 11 can be strongly secured to the card base body 14 by injection molding with the synthetic resin.

In the above-described embodiments, although a pair of holding projections 16b are disposed on the the upper mold 16 to form the pair of guide grooves 14a, the number of the projections, that is the number of the guide grooves, may be increased.

As described above and according to the present invention, the terminal board portion is disposed at an end portion of the circuit board projecting from the surface of the circuit board, the electrode terminals are formed on the surface of the terminal board portion, and the IC module is mounted on the reverse side of the circuit board. The circuit board and IC are embedded in a card base body by molding with a synthetic resin, and thereby only the terminals are exposed. Consequently, the circuit board does not appear outside of the IC card, warping of the card can be prevented, its reliability can be improved, no limitation on applying a design of the IC card is produced, and the appearance is improved.

At least a pair of guide grooves are formed which has the depth from the reverse side of the card base body to the reverse side of the terminal board portion and extends in the insertion direction of the IC card, the guide grooves being disposed at an end of the card base body. These guide grooves are formed by holding projections formed in a mold half used from the molding. Since the thus-formed holding projections press down the reverse side of the terminal board disposed on the bottom surface of the recessed portion of the other mold half, they can also be used as means for securing the circuit board portion disposed in the mold. As a result, the structure of the securing means can be simplified compared to that of the conventional securing means, and securing the circuit board portion can be conducted easily.

In addition, the structure may be so arranged that a pair of positioning holes are formed on the terminal board portion surface of the circuit board, and positioning pins, each having a length shorter than the thickness of the board and terminal portion, are formed for the purpose of introducing the synthetic resin for the card base body into a part of the positioning holes at the time of the injection molding. As a result, positioning of the circuit board portion can be conducted easily and the circuit board is firmly bonded to the card base body.

What is claimed is:
1. An IC card comprising:
   a circuit board having two opposed ends, opposed obverse and reverse surfaces, and including interconnection circuitry disposed on the reverse surface;
   a terminal board disposed at one end of the circuit board and projecting from the obverse surface of the circuit board, the terminal board having an obverse side spaced from the obverse surface of the circuit board;

at least one electrical terminal projecting from the obverse side of the terminal board and electrically connected to the interconnection circuitry;

an IC module mounted on the reverse side of the circuit board and electrically connected to the interconnection circuitry;

and a card base body of synthetic resin having opposed obverse and reverse sides in which the circuit board, the IC module, and the terminal board are embedded with said electrical terminal exposed at the obverse side of the card base body.

2. An IC card according to claim 1 wherein said card base body has two opposed ends comprising a pair of guide grooves disposed in one of the ends of said card base body having a depth from the reverse side of said card base body to the reverse surface of said circuit board and extending in the direction in which said IC card is inserted into external equipment.

3. An IC card according to claim 2 including at least a pair of positioning recesses having a depth from the obverse side of said card base body to the obverse surface of said circuit board at the end of the circuit board adjacent said terminal board.

* * * * *